(12) United States Patent
Verma et al.

(10) Patent No.: US 7,824,935 B2
(45) Date of Patent: Nov. 2, 2010

(54) METHODS OF COMBINATORIAL PROCESSING FOR SCREENING MULTIPLE SAMPLES ON A SEMICONDUCTOR SUBSTRATE

(75) Inventors: Gaurav Verma, Sunnyvale, CA (US);
Kurt Weiner, San Jose, CA (US);
Prashant Phatak, San Jose, CA (US);
Imran Hashim, Saratoga, CA (US);
Sandra Malhotra, San Jose, CA (US);
Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 68 days.

(21) Appl. No.: 12/167,118

(22) Filed: Jul. 2, 2008

(65) Prior Publication Data

US 2010/0001269 A1     Jan. 7, 2010

(51) Int. Cl.
 *H01L 21/00* (2006.01)
(52) U.S. Cl. .................................. 438/18; 257/E21.008
(58) Field of Classification Search ............. 438/14–18, 438/957; 257/E21.008
See application file for complete search history.

(56) References Cited

U.S. PATENT DOCUMENTS

2007/0202614 A1* 8/2007 Chiang et al. ................. 438/14
2009/0155936 A1* 6/2009 Weiner et al. ................. 438/17

* cited by examiner

*Primary Examiner*—Richard A. Booth (57) ABSTRACT

In embodiments of the current invention, methods of combinatorial processing and a test chip for use in these methods are described. These methods and test chips enable the efficient development of materials, processes, and process sequence integration schemes for semiconductor manufacturing processes. In general, the methods simplify the processing sequence of forming devices or partially formed devices on a test chip such that the devices can be tested immediately after formation. The immediate testing allows for the high throughput testing of varied materials, processes, or process sequences on the test chip. The test chip has multiple site isolated regions where each of the regions is varied from one another and the test chip is designed to enable high throughput testing of the different regions.

8 Claims, 9 Drawing Sheets

Top View    Side View

Top View

Side View

METHODS OF COMBINATORIAL PROCESSING FOR SCREENING MULTIPLE SAMPLES ON A SEMICONDUCTOR SUBSTRATE

FIELD OF THE INVENTION

The present invention relates generally to semiconductor processing. More specifically, a method of high throughput combinatorial processing for screening multiple samples on a test chip and the test chip used for the method is described.

BACKGROUND OF THE INVENTION

As fabrication techniques improve, it is becoming possible to fabricate semiconductor devices with increasingly small dimensions. However, as device dimensions shrink, scaling issues are posing challenges for traditional semiconductor device technology. This has lead to the investigation of alternative materials that can be used to improve performance of semiconductor devices without necessarily depending on the scaling down of devices to improve performance and speed.

A challenge in the investigation of new materials is the slowing down of the development cycle and the learning rate due to traditional processing of an entire substrate that is designed for large scale manufacturing of electronic devices. The processing of the entire substrate can be disadvantageous because the entire substrate is nominally made the same using the same material(s), process(es), and process sequence integration scheme. Conventional full wafer uniform processing results in fewer data per substrate, longer times to accumulate a wide variety of data, and higher costs associated with obtaining such data. Consequently, in order to increase productivity and decrease manufacturing cost there is a need to run more than one processing condition, more than one sequence of processing conditions, more than one process sequence integration flow, and combinations of the same on a single monolithic substrate. This is collectively referred to as "combinatorial process sequence integration."

A challenge to combinatorial process sequence integration is the traditional manufacturing approach involving lithography and etching to define the device containing the material being screened. In particular, new etching processes may be required for each material being tested. This would slow down development significantly. It is also unknown how the lithography, etching, and polishing used in the traditional approach would affect the materials being screened, thus clouding the results. The testing of new materials also creates the obstacle of having to qualify the necessary processing tools for each of the new materials. Qualification can take several months. New materials also raise concerns of poisoning of a fabrication plant process line and create further challenges for the abatement of the chemical waste created by new chemicals used in processing. Because of these risks to the tools and to the Fab, conventional processes are not practical for high-throughput combinatorial screening.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In embodiments of the current invention, methods of combinatorial processing and a test chip for use in these methods are described. These methods and test chips enable the efficient development of materials, processes, and process sequence integration schemes for semiconductor manufacturing processes. In general, the methods simplify the processing sequence of forming devices or partially formed devices on a test chip such that the devices can be tested immediately after formation. The immediate testing allows for the high throughput testing of varied materials, processes, or process sequences on the test chip. The test chip has multiple site isolated regions where each of the regions is varied from one another and the test chip is designed to enable high throughput testing of the different regions.

Figure 1:
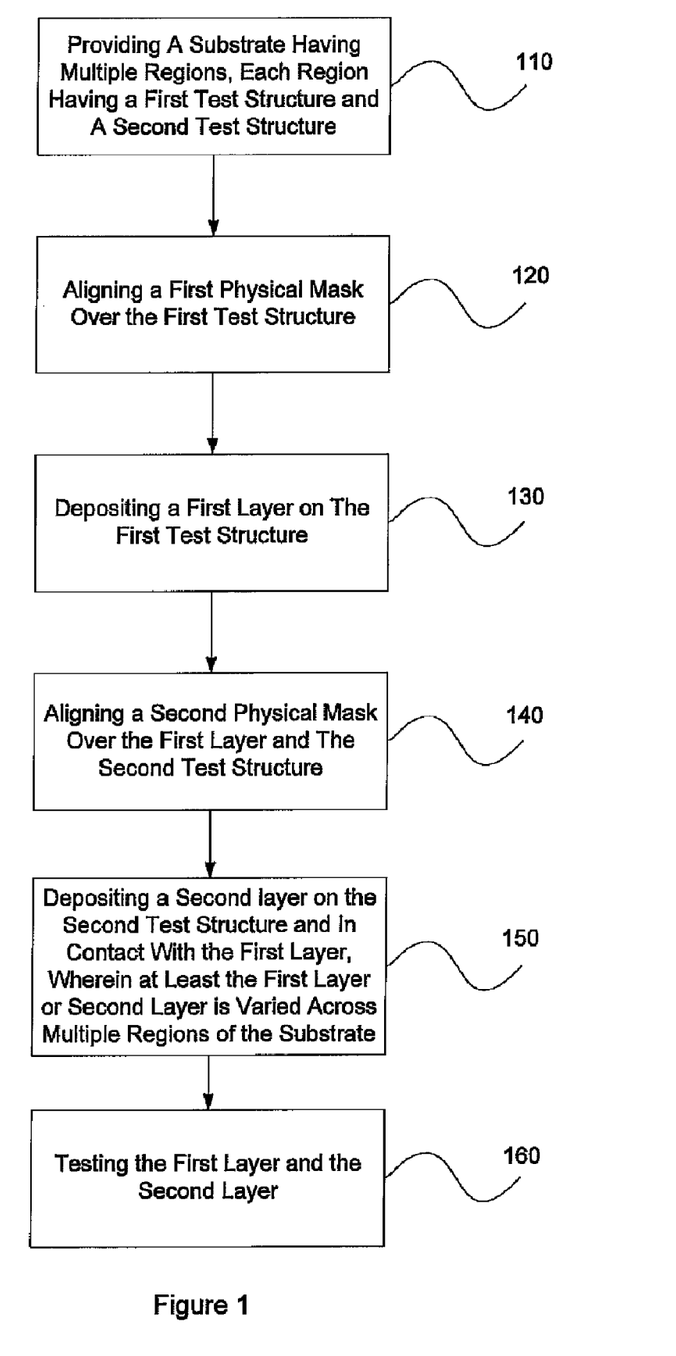
FIG. 1 is a flowchart describing a process for a high-throughput combinatorial screening method according to one embodiment of the current invention.
Figure 2:
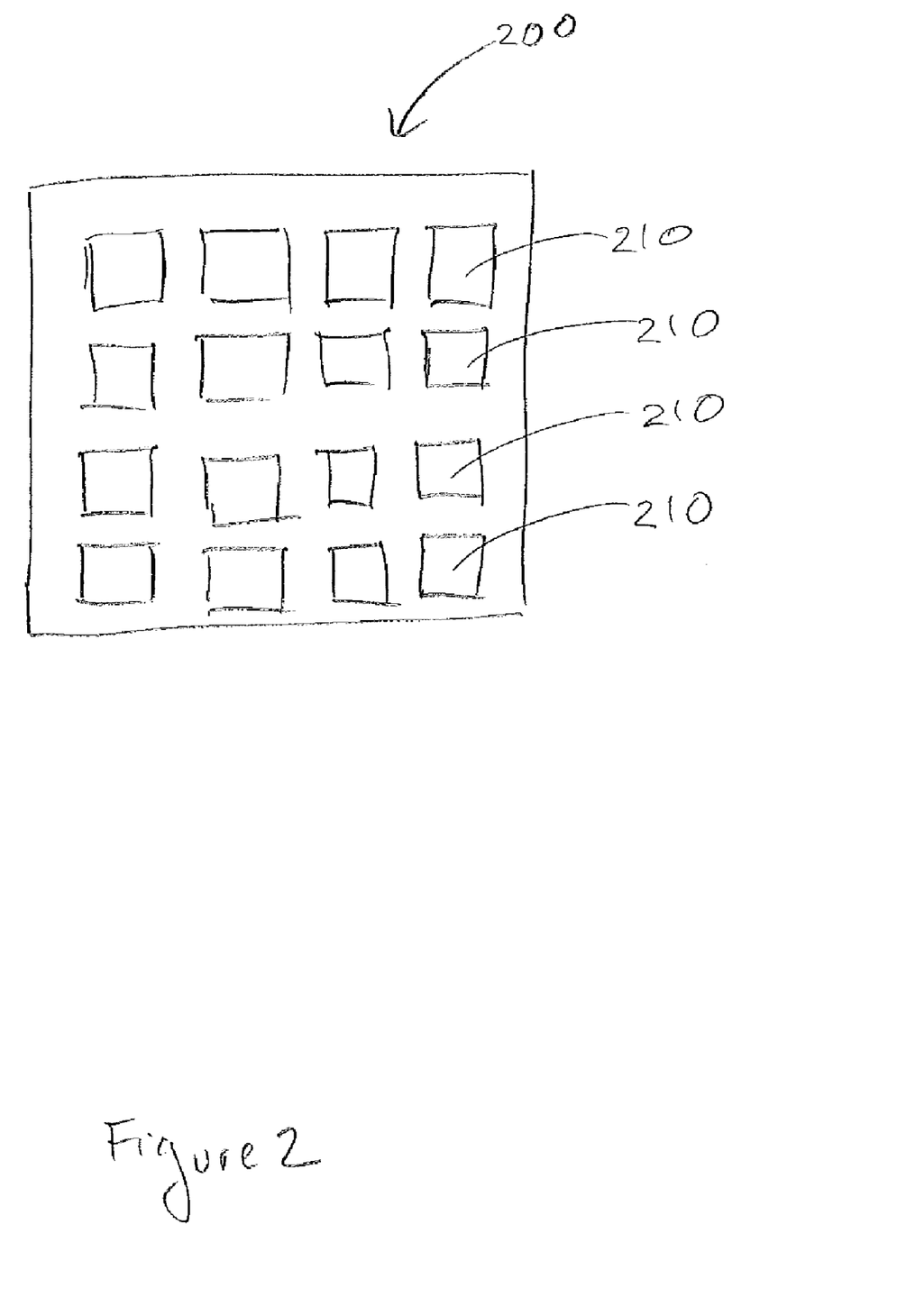
FIG. 2A illustrates a test chip according to one embodiment of the current invention.
FIGS. 2B through 2F illustrate a method of forming and testing a test chip according to one embodiment of the invention.

An embodiment of a method of combinatorial processing is outlined in flowchart 100 in FIG. 1. This method allows for the high throughput screening of materials, processes, or process sequences that are varied among different regions on a substrate. The variation is introduced in a controlled manner, so that testing will determine any differences due to the variation without having to be concerned with external factors causing testing anomalies. The method is performed by first, at block 110, providing a substrate, or test chip, having multiple regions, each region having a first structure and a second structure. The substrate 200 having multiple regions 210 is illustrated in FIG. 2A. The substrate 200 can be, for example, a test chip formed on a semiconductor wafer or coupon. The semiconductor materials used to form the wafer or coupon may be, for example, silicon, silicon-on-insulator, or gallium arsenide. Each of the regions 210 in FIG. 2A is site isolated, meaning that the regions 210 do not electrically interfere with one another. Site isolation is valuable because the regions can be efficiently tested and the results of the testing can be attributed to the variations being tested in those regions.

Figure 2B:
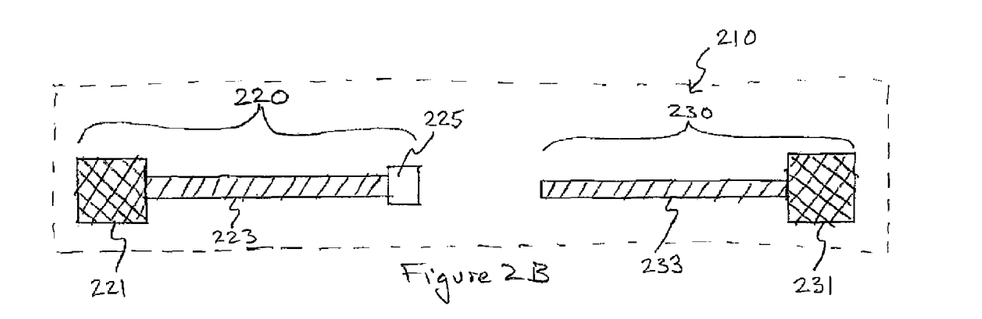

FIG. 2B illustrates a detailed view of a region 210. The region 210 includes a first test structure 220 and a second test structure 230. The first test structure 220 and the second test structure 230 are preformed so that a minimum number of steps are required in forming a device or partially formed device within each of the regions 210 of the substrate 200. In the particular embodiment illustrated in FIGS. 2B-2F, the device that is formed and tested is a metal-insulator-metal (MIM) structure. In its most basic form, the MIM structure includes two electrodes (each having one or more materials and/or layers) and one or more layers of one or more metal oxides disposed in between. The device or partially formed device generally has a metal-insulator-metal (MIM) capacitor structure, although other structures such as metal-insulator-insulator-metal (MIIM) and metal-insulator-insulator-insulator-metal (MIIIM) can be used as described herein. This example is not meant to be limiting because other types of devices or partially formed devices may also take advantage of this method.

In this embodiment, the first test structure 220 is formed of a first test pad 221, a first interconnect 223, and a bottom electrode 225. The first test pad 221 and the first interconnect 223 can be formed of any suitable conductive material, such as tungsten. Electrode materials used to form the bottom electrode 225 or the top electrode 270 may include silicon, silicides, titanium nitride (TiN), platinum, iridium, iridium oxide, ruthenium and ruthenium oxide. According to some embodiments, one electrode may be a higher work function material, and the other electrode may be a lower work function material. For example, in one embodiment, at least one electrode is a high work function material such as a noble or near noble metal. Noble or near noble metals include iridium, iridium oxide, platinum, ruthenium, and ruthenium oxide. In other embodiments, the electrodes can be multi-layer electrodes that can include one or more different materials. For example, an electrode can include a layer of ruthenium and ruthenium oxide, or a layer of iridium, iridium oxide, or platinum with a capping layer of tungsten, tungsten carbonitride, or tungsten carbon. The multi-layer electrodes can be used to improve adhesion properties and performance of memory elements in some configurations and embodiments. The second test structure 230 is formed of a second test pad 231 and a second interconnect 233.

Figure 2C:
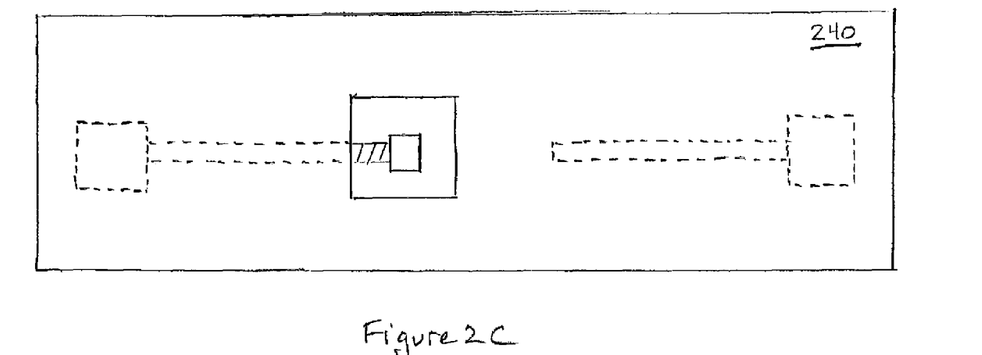

In block 120 of flowchart 100, the step of aligning a first physical mask 240 over the first structure 220 is described. The first physical mask 240 can be a shadowmask formed of metal that is clamped to the substrate 200. As illustrated in FIG. 2C, the first physical mask 240 is patterned to expose a portion of the first structure including the bottom metal electrode 225 and a portion of the first interconnect 223. Aligning the first physical mask 240 to expose this particular portion may be done by aligning a marking on the first physical mask with a marking or distinctive feature on the substrate 200.

Figure 2D:
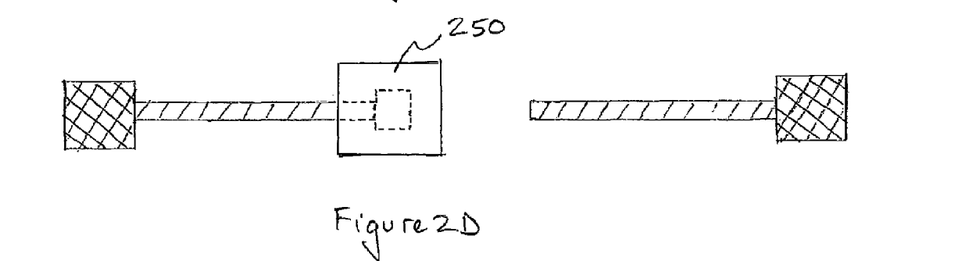

At block 130 of the flowchart 100, a first layer 250 is deposited on the first structure 220. The first layer 250 may be deposited by any method used to deposit thin films including dry (CVD, ALD, PVD, PLD, evaporation) and wet (electroless deposition, electrochemical deposition) techniques. In the embodiment where a MIM is being formed as the device to be tested, the first layer 250 is an insulating layer. The insulating layer may be a combination of multiple insulating materials stacked over one another or codeposited, or alternatively may be a combination of an interface layer formed over the bottom electrode 235 and an insulator.

In one particular embodiment, the MIM is formed to test materials, unit processes, process sequences, or process conditions for phase change memory (PCM) and resistive random access memory (ReRAM). For testing these types of memory, the insulator is a switching element. In this embodiment the switching element is a PCM material or a ReRAM material (e.g. a chalcogenide alloy, metal oxide, or perovskite). Many variations of the phase change materials or the resistive materials can be tested on the test chip by varying the materials deposited in the different site isolated regions 210. For PCM, the switching element may be a metal oxide, such as hafnium oxide, aluminum oxide, tantalum oxide, niobium oxide, zirconium oxide, and yttrium oxide. If the metal oxide is a binary or ternary metal oxide, the metal oxide may be co-deposited. In alternate embodiments the metal oxide may be co-deposited with other metal oxides or the metal oxide can be doped with another metal oxide or a rare earth metal.

In another particular embodiment, the MIM is a partially formed device to test materials, unit processes, process sequences, or process conditions for dynamic random access memory (DRAM.) For the DRAM embodiment the insulator is a high dielectric constant (k) material. A high dielectric constant material is defined as a material having a dielectric constant (k) above 3.9. Examples of high k materials include halfnium dioxide, zirconium dioxide, and titanium dioxide. These materials may be deposited by atomic layer deposition (ALD.) The metals used to form the MIM are metals with high work functions and will not react with the high k materials. Additionally, the metals must be thermally stable at high temperatures. For example, tantalum-based metal gates may be used.

Figure 2E:
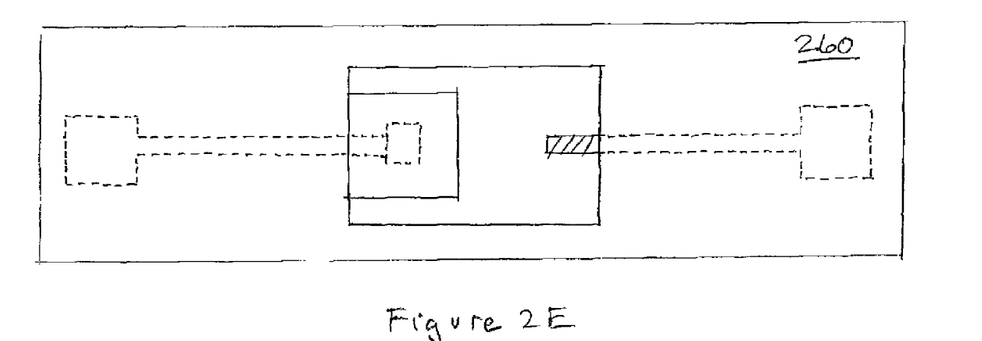

At block 140 of flowchart 100, the second physical mask 260 is aligned over the first layer 250 and the second test structure 230. FIG. 2E illustrates this step of the method. The second physical mask 260 is patterned to expose the first layer 250 and a portion of the second interconnect 231. The alignment of the second physical mask 260 may be performed in the same way as the first physical mask 240. In an embodiment, the first mask and the second mask are the same physical mask and the second alignment step is not required.

Figure 2F:
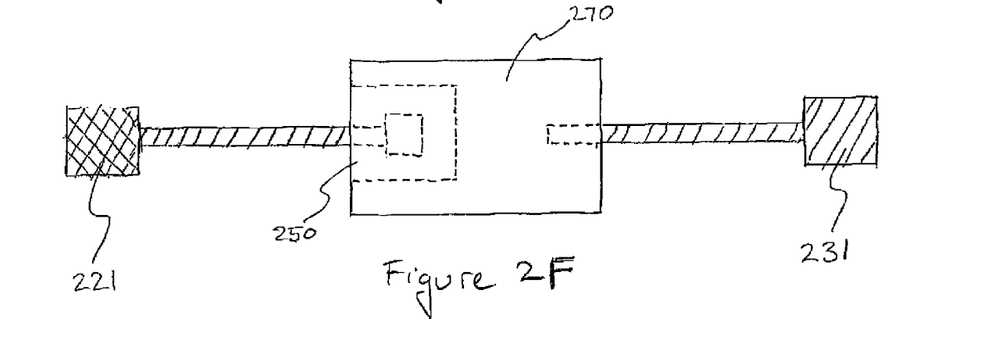

A second layer 270 is then deposited on the second test structure 230 and in contact with the first layer 250 to form a memory element. The second layer 270 is formed of a conductive material to form a conductive layer and cannot be in contact with the first test structure 230 or the device or partially formed device being formed will be shorted and cannot be tested. At least the first layer 250 or the second layer 270 is varied across multiple regions of the substrate. In another embodiment both the first layer 250 and the second layer 270 can be varied. The layers can be varied by varying the materials used to form the first layer 250 or the second layer 270 or the process conditions used to form the layer. The processing conditions can be varied by varying process material amounts, reactant species, processing temperatures, processing times, processing pressure, processing flow rates, processing powers, processing reagent compositions, the rates at which the reactions are quenched, deposition order of process materials, process sequence steps, etc., can be varied from one region 210 to another region 210 on the substrate 200. Thus, for example, when exploring materials, a processing material delivered to first and second regions 210 can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reaction are quenched, atmospheres in which the processes are conducted, an order in which materials are deposited, etc. It should be appreciated that these process parameters are exemplary and not meant to be an exhaustive list as other process parameters commonly used in semiconductor manufacturing may be varied.

Figure 3:
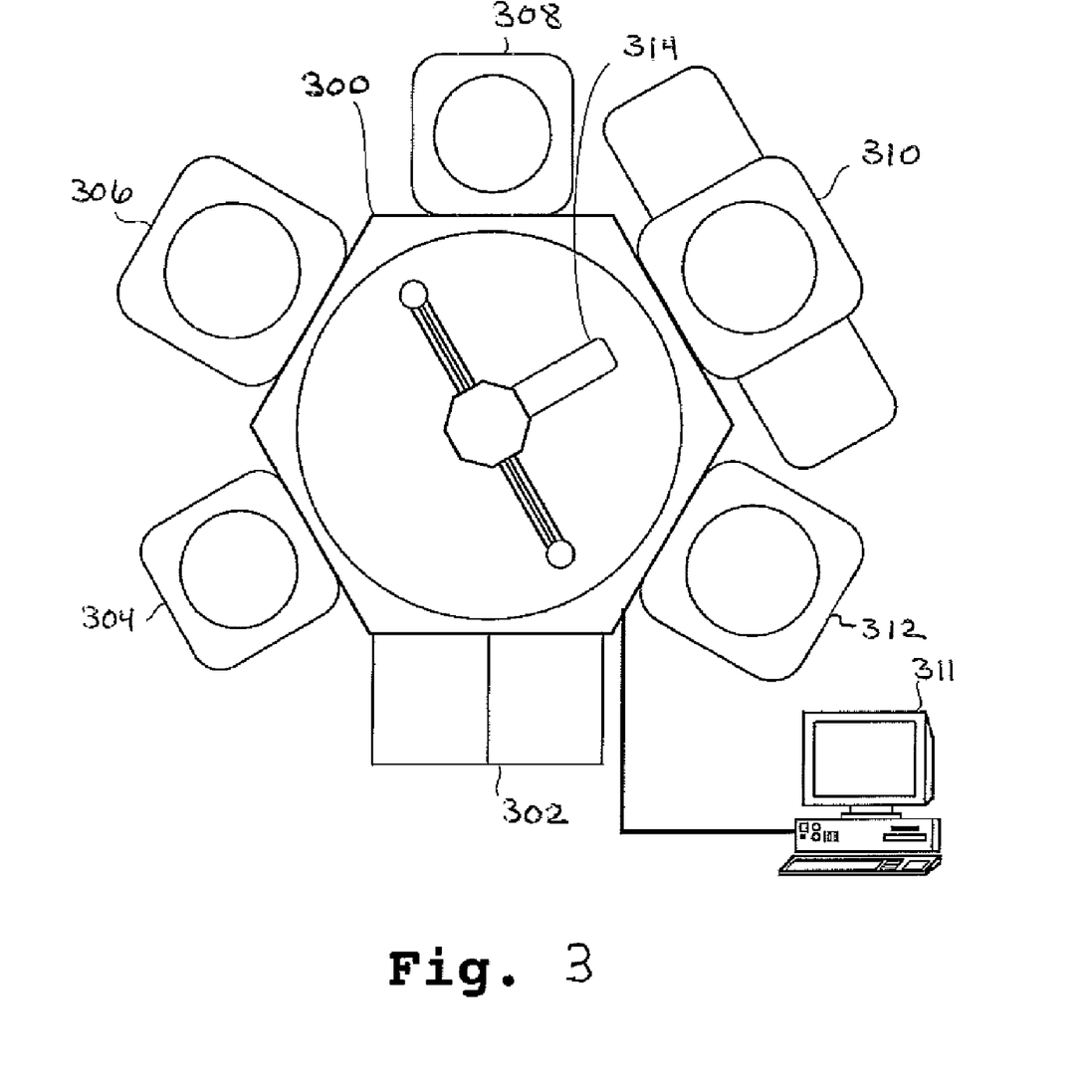
FIG. 3 illustrates an integrated high performance combinatorial processing system.

The masking and deposition steps described in blocks 120-150 can be performed in an integrated high productivity combinatorial (HPC) deposition system as illustrated in FIG. 3. HPC deposition system includes a frame 300 supporting a plurality of processing modules. Load lock/factory interface 302 provides access into the plurality of modules of the HPC deposition system. In accordance with one embodiment, load lock/factory interface 302 may include a FOUP. Robot 314 provides for the movement of substrates (and masks) between the modules and for the movement into and out of the load lock 302. Modules 304 to 312 may be various well known modules, such as degas or clean modules or full wafer deposition chamber, but at least one will be a HPC module. As an example, the HPC deposition system may have an orientation/degassing module 304, HPC ALD or PVD module 306, library module 308 for storing masks, HPC PVD module 310 containing moving shutters, and post-processing module 312. The plurality of masks stored in module 308 may be used in the combinatorial processing modules in order to apply a certain pattern to a substrate being processed in those modules. Library module 308 and the masks contained therein enable the features to spatially vary across layers of substrates being processed. Furthermore, the site isolation processing is capable of being performed with spatial definition across multiple layers without incurring a vacuum break during the processing in the high productivity combinatorial (HPC) deposition system described herein. In the examples cited elsewhere in this application, the MIM may be constructed within the HPC processing tool without breaking vacuum by using HPC PVD or ALD module 304 to deposit the insulator layer(s) and HPC PVD module 310 to deposit the top electrode. The capability of spatially varying the feature sets through the different masks, in conjunction with the controlled environment processing of the HPC deposition module, offers a powerful tool for evaluating various material components independently or contemporaneously with various process sequences.

The various modules, including HPC modules 304 and 310 may be replaced with alternate modules, including those capable of performing conventional full-wafer processing, such as physical vapor deposition (PVD), chemical vapor deposition (CVD), atomic layer deposition (ALD), plasma enhanced atomic layer deposition (PEALD), rapid thermal processing (RTP), etc. As shown, module 310 includes shutter garages containing moveable shutters that can move in a planar direction in order to partially block off a mask supplied to module 310 from module 308.

It should be appreciated that while FIG. 3 illustrates a specific configuration of the modules, this configuration is not meant to be limiting. That is, any combination of modules may be incorporated in the HPC deposition system as long as a HPC processing module, such as module 310 is included. Thus, numerous configurations of the processing system of FIG. 3 are possible. A centralized controller, i.e., computing device 311, may control the processes of the HPC system. Alternatively, each module may have a controller in communication with centralized computing device 311. Of course, controllers may be local to some modules while other modules may be controlled through centralized computing device 311.

At block 160 of flowchart 100, the first layer 250 and the second layer 270 are tested through coupling a first test probe to the first test structure 220 and coupling a second test probe with the second test structure 230. In one embodiment the first and second test probes electrically couple the first test pad 221 to the second test pad 231 and applying a voltage to the first test pad 221. In the embodiment where the MIM includes a switching element, such as a PCM or a ReRAM material, the voltage applied to the first test pad 221 is determined by what voltage is required to change the phase of the switching element or to change the resistance of the switching element. In the particular embodiment of testing the PCM material the voltage is determined by what voltage is required to cause the bottom electrode, which is a resistive metal, to heat the PCM switching element to change the phase of the switching element. In the embodiment where the MIM is designed to test DRAM materials, such as a high dielectric insulator material or a metal with a high work function. The testing can be done to test the performance of the material used to form first layer 250 or the material used to form second layer 270. The testing may provide information on any of the parameters or process conditions that are varied between the regions 210. For example, the testing of the first layer 250 and the second layer 270 through coupling the first test structure 221 with the second test structure 231 is done to test an interface between the first layer and the second layer. Each of or one of the first and second layers may be formed of one or more sub-layers or multiple layers.

An additional advantage of this testing methodology is the ease of testing the first test pad 221 and the second test pad 231 using standard probes. The test pads can be sized and spaced to allow for efficient and simple testing. The test pads are positioned local to the devices or partially formed devices being tested to minimize and control line resistivity issues.

The testing can be performed immediately after depositing the second layer because no subsequent steps relating to patterning a blanket deposited layer are necessary before testing the first and the second layer. For example, no etching step is necessary before testing the first layer and the second layer. The conventional patterning steps of blanket deposition, lithography, etching, planarization and cleaning are eliminated by using physical masks to form the first layer 250 and the second layer 270. This allows for a high-throughput combinatorial screening methodology. There is no lag time for qualifying tools or processing chemistries or parameters to perform conventional patterning steps. The development cycle and learning rate can be greatly accelerated by the embodiments of the methods described. Additionally, the results from the combinatorial processing and high-throughput testing are independent of post-deposition interactions which can have a major impact on the electrical results as well. Using the methods described herein, the intrinsic material properties can be assessed independent of the downstream processing that would be associated with conventional patterning steps. There is also the advantage of being able to test many different materials, unit processes, process conditions, or process sequences on a single substrate that requires very few process steps.

In an embodiment, the screening is performed on primary, secondary, and tertiary levels of combinatorial process sequencing. This methodically optimizes the materials, unit processes, and process sequences through multiple iterations of the combinatorial process. For example, based on the results of the primary screening where desired characteristics of materials, unit processes, or process sequences are identified, those identified can be performed in a conventional (non-combinatorial manner) while other aspects of the materials, unit process or process sequence can be varied combinatorially in secondary and tertiary screening. The iterative repeating of this process eventually yields an optimized semiconductor manufacturing process, which takes into account the interaction of the process and the process sequence as opposed to a material-centric view-point. The test chip and the inventive method of forming devices or partially formed devices on that test chip enables efficient iterative combinatorial screening where the varied regions of the test chip can be formed and tested quickly.

Figure 4:
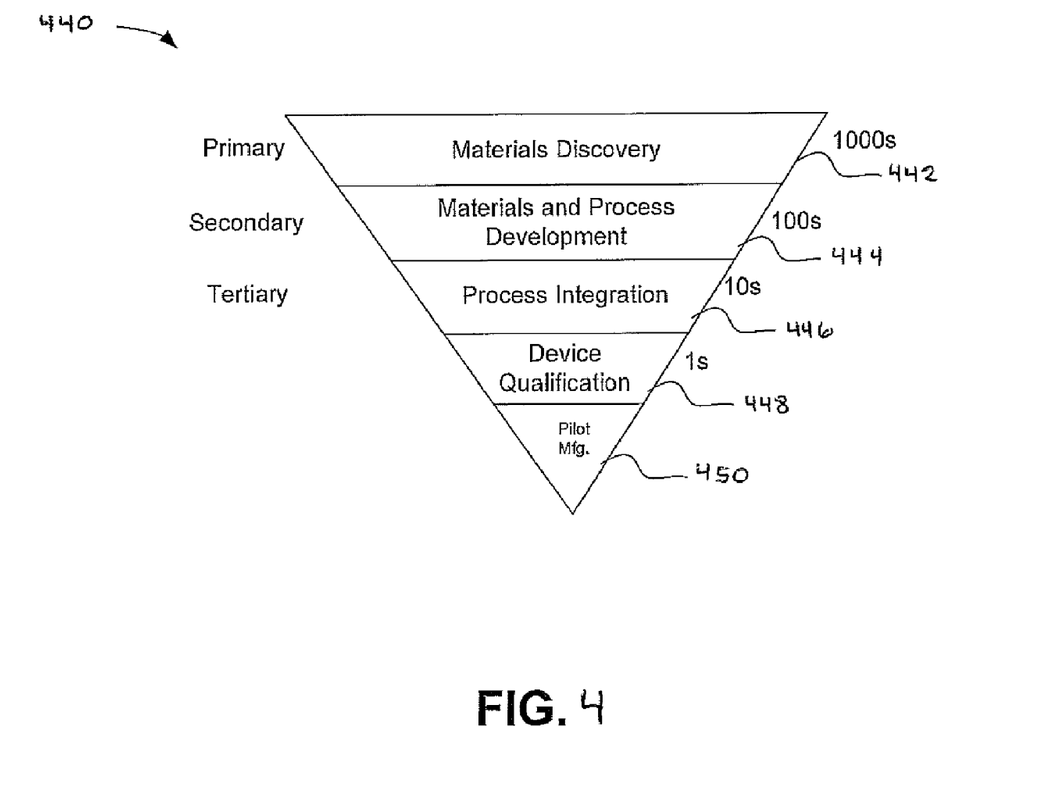
FIG. 4 is a schematic diagram for implementing combinatorial processing and evaluation.

FIG. 4 illustrates a schematic diagram 440 for implementing combinatorial processing and evaluation using the primary, secondary, and tertiary screening described above. The schematic diagram 440 illustrates that the relative number of combinatorial processes run with a group of substrates decreases as certain materials and/or processes are selected. Generally, combinatorial processing includes performing a large number of processes during a first screen, selecting promising candidates from those processes, performing the selected processing during a second screen, selecting promising candidates from the second screen, and so on. In addition, feedback from later stages to earlier stages can be used to refine the success criteria and provide better screening results.

For example, thousands of materials are evaluated during a materials discovery stage 442. Materials discovery stage 442 is also known as a primary screening stage performed using primary screening techniques. Primary screening techniques may include dividing wafers into coupons and depositing materials using varied processes. The materials are then evaluated, and promising candidates are advanced to the secondary screen, or materials and process development stage 444. Evaluation of the materials is performed using metrology tools such as electronic testers and imaging tools (i.e., microscopes).

The materials and process development stage 444 may evaluate hundreds of materials (i.e., a magnitude smaller than the primary stage) and may focus on the processes used to deposit or develop those materials. Promising materials and processes are again selected, and advanced to the tertiary screen or process integration stage 446, where tens of materials and/or processes and combinations are evaluated. The tertiary screen or process integration stage 446 may focus on integrating the selected processes and materials with other processes and materials.

The most promising materials and processes from the tertiary screen are advanced to device qualification 448. In device qualification, the materials and processes selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to manufacturing 450.

The schematic diagram 440 is an example of various techniques that may be used to evaluate and select materials and processes for the development of semiconductor devices. The descriptions of primary, secondary, etc. screening and the various stages 442-450 are arbitrary and the stages may overlap, occur out of sequence, be described and be performed in many other ways.

Figure 5:
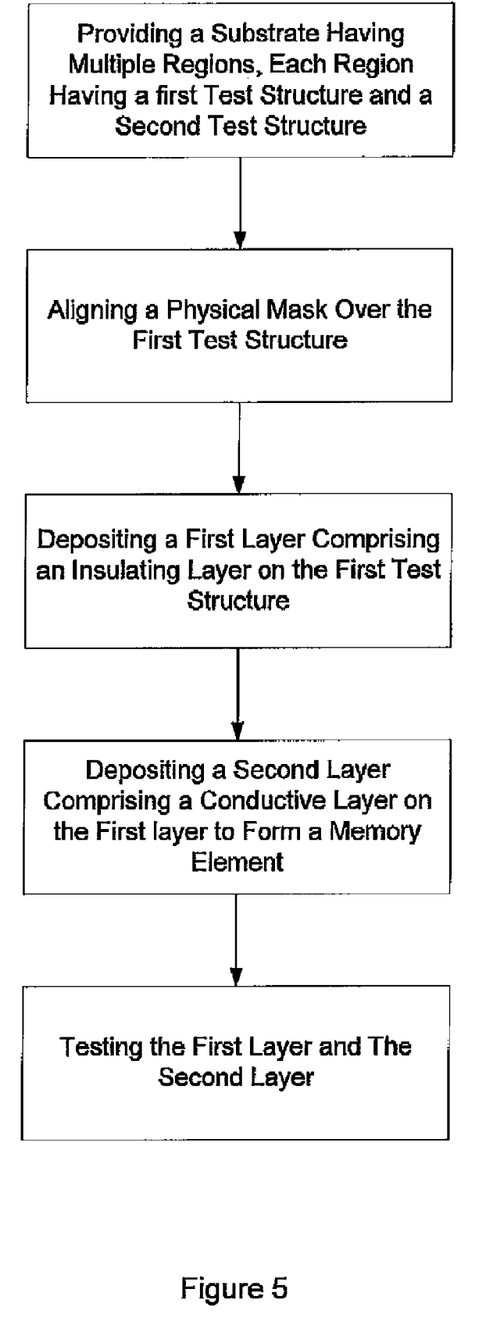
FIG. 5 is a flowchart describing a process for a high-throughput combinatorial screening method according to one embodiment of the current invention.
Figure 6A:
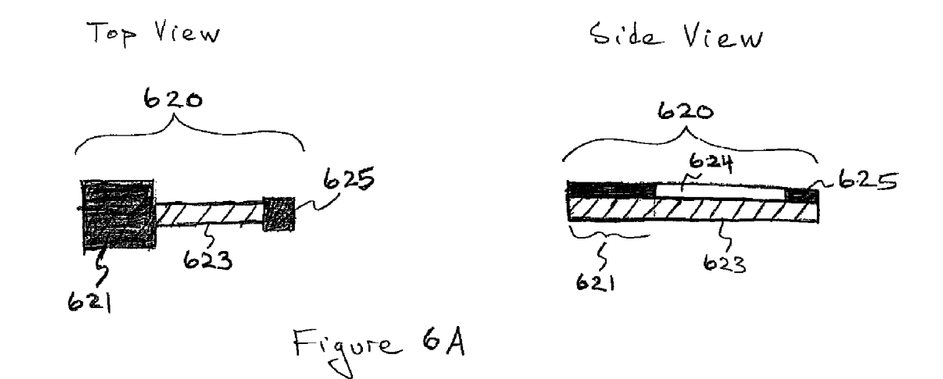
FIGS. 6A through 6E illustrate a method of forming and testing a test chip according to one embodiment of the invention.
Figure 6B:
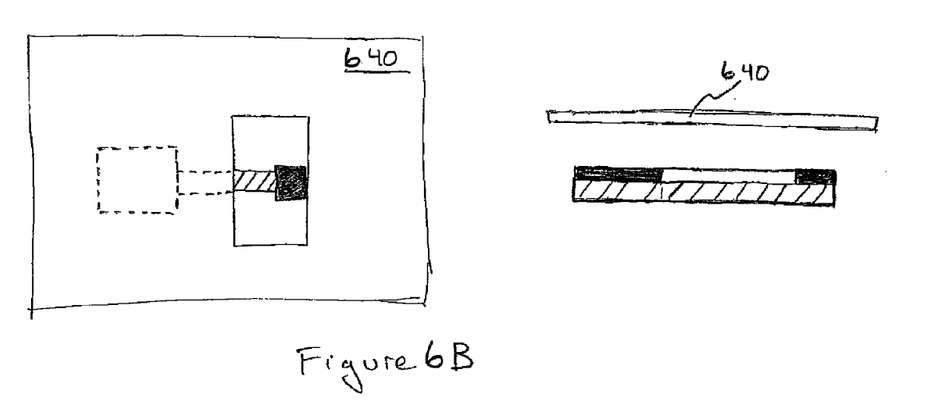

In an alternate embodiment of the current invention, the first physical mask is kept in place after depositing the first layer and used to pattern the second layer. This embodiment is outlined in FIG. 5, flowchart 500. In this embodiment a substrate 200 (FIG. 2) having multiple regions 210 that are site isolated is provided at block 401 of the flowchart 400. Each of the regions 210 has a test structure 620 as illustrated in FIG. 6A. The test structure 620 is formed of a test pad 621 and a bottom electrode 625 that can form a memory element with further processing. In the side view, a dielectric 624 is also part of the test structure 620 but is not shown in the top view for the sake of clarity. As illustrated in FIG. 6B, a physical mask 640 is used in this embodiment to pattern a device or a partially formed device that can be tested in a high throughput combinatorial methodology. The device or partially formed device generally has a metal-insulator-metal (MIM) capacitor structure, although other structures such as metal-insulator-insulator-metal (MIIM) and metal-insulator-insulator-insulator-metal (MIIIM) can be used as described herein.

Figure 6C:
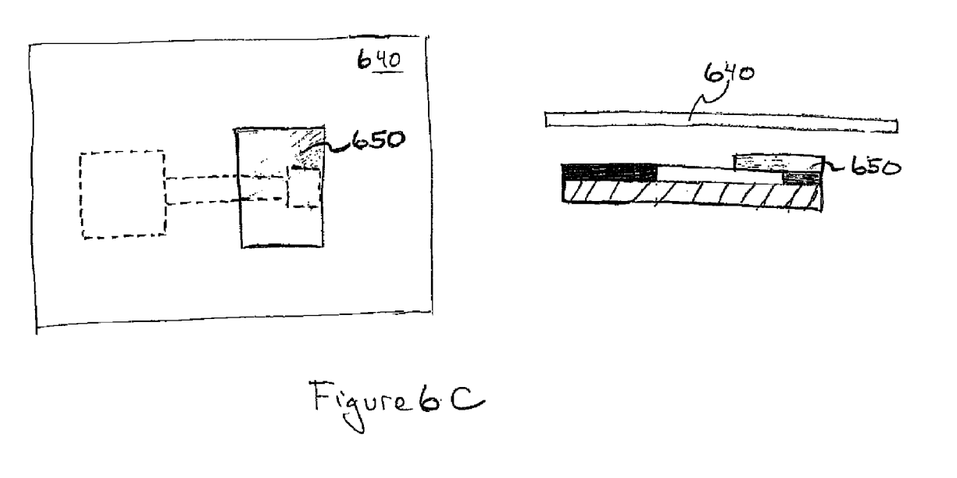

At block 502, the physical mask 640 is aligned over the first test structure 620 to expose the bottom electrode 625 and a portion of the interconnect 623 and the dielectric 624. A first layer 650 comprising an insulating layer is then deposited, at block 503, on the test structure 620 using the physical mask 640 as a pattern, as shown in FIG. 6C. The first layer 650 may be deposited by any method used to deposit thin films including dry (CVD, ALD, PVD, PLD, evaporation) and wet (electroless deposition, electrochemical deposition) techniques. In the embodiment where a MIM is being formed as the device or partially formed device to be tested, the first layer 650 is an insulator material. The insulator material may be formed of multiple layers of insulating materials stacked over one another or codeposited, or alternatively may be a combination of an interface layer formed over the bottom electrode 625 and an insulator.

In one particular embodiment, as described above, the MIM memory element is formed to test materials for phase change memory (PCM) and resistive random access memory (ReRAM). For testing these types of memory, the insulator is a switching element. In this embodiment the switching element is a PCM (such as a metal oxide) or a ReRAM (such as a chalcogenide alloy) material. In another particular element, the MIM memory element is formed to test materials, unit processes, process sequences, or process conditions for dynamic random access memory (DRAM.) For the DRAM embodiment the insulator is a high dielectric constant (k) material. The metals used to form the MIM memory element are metals with high work functions and will not react with the high k materials. Additionally, the metals must be thermally stable at high temperatures.

Figure 6D:
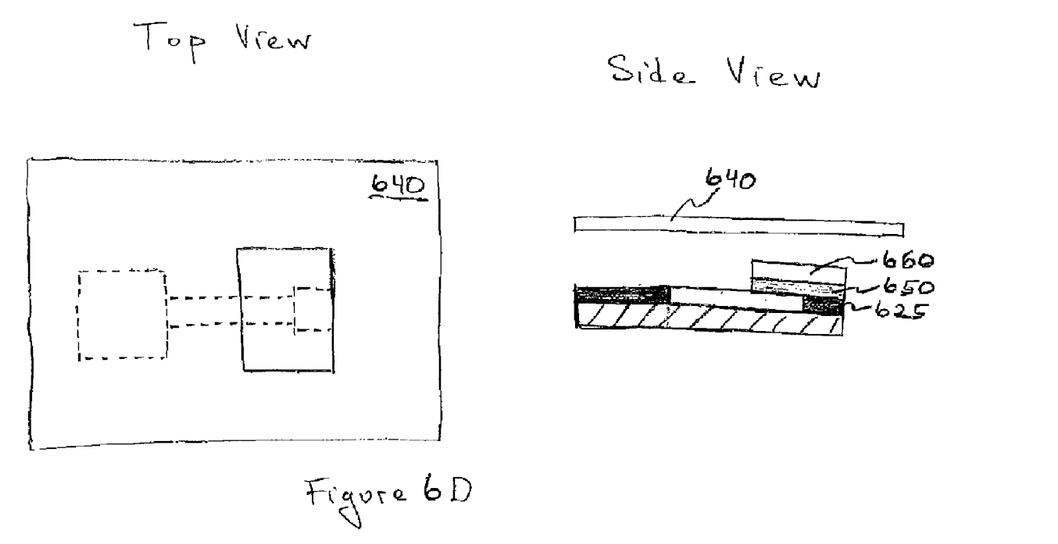

As illustrated in FIG. 6D, the physical mask 640 is kept in the same position and a second layer 660 comprising a conductive layer is deposited on the first layer 650 to form a memory element at block 504 of the flowchart 500. At least the first layer 650 or the second layer 660 is varied across the multiple regions of the substrate. The use of a single physical mask further simplifies the processing of the test chip and provides an even more efficient process of combinatorially processing multiple site isolated regions 210 that vary from one to another. And additionally, this is another process where no lithography related steps are required to pattern the first layer 650 or the second layer 660.

Figure 6E:
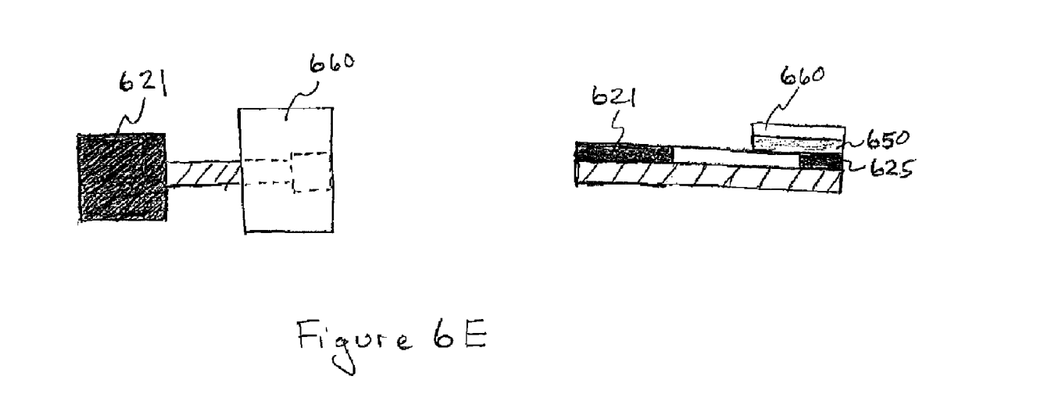

At block 505 of the flowchart 500, the first layer and the second layer are tested by coupling the test pad 621 of the test structure 620 with the second layer 660. In one embodiment a first test probe is coupled to the test structure 620 and a second test probe is coupled to the conductive layer 660 to electrically couple the first test pad 621 to the conductive layer 660 and applying a voltage to the first test pad 621. In the embodiment where the MIM includes a switching element, such as a PCM material or a ReRAM material, the voltage applied to the test pad 621 is determined by what voltage is required to change the phase of the switching element or to change the resistance of the switching element. In the embodiment where the MIM is designed to test DRAM materials, such as a high dielectric insulator material or a metal with a high work function. The testing can be done to test the performance of the material used to form first layer 650 or the material used to form second layer 570.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of combinatorial processing, comprising:
providing a substrate having multiple regions, each region having a test structure;
aligning a physical mask over the test structure;
depositing a first layer comprising an insulating layer on the test structure;
depositing a second layer comprising a conductive layer on the first layer to form a memory element, wherein at least the first layer or the second layer is varied across multiple regions of the substrate; and
testing the first layer and the second layer.

2. The method of claim 1, wherein the testing is performed immediately after depositing the second layer.

3. The method of claim 1, wherein no etching step is necessary before testing the first layer and the second layer.

4. The method of claim 1, wherein the physical mask is used to pattern both the first layer and the second layer.

5. The method of claim 1, wherein testing the first layer and the second layer comprises coupling a first test probe to the test structure and a second test probe to the conductive layer.

6. The method of claim 1, wherein the insulating layer is formed of multiple layers.

7. The method of claim 1, wherein the conductive layer is formed of multiple layers.

8. The method of claim 1, wherein the first layer or the second layer is varied across multiple regions of the substrate by varying materials, process conditions, and process sequences.

* * * * *